United States Patent
Cheng et al.

(10) Patent No.: US 9,865,587 B1
(45) Date of Patent: Jan. 9, 2018

(54) METHOD AND STRUCTURE FOR FORMING BURIED ESD WITH FINFETS

(71) Applicant: International Business Machines Corporation, Armonk, NY (US)

(72) Inventors: Kangguo Cheng, Schenectady, NY (US); Nicolas J. Loubet, Guilderland, NY (US); Xin Miao, Guilderland, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/651,503

(22) Filed: Jul. 17, 2017

Related U.S. Application Data (62) Division of application No. 15/184,698, filed on Jun. 16, 2016, now Pat. No. 9,716,086.

(51) Int. Cl.
| | |
|---|---|
| *H01L 21/324* | (2006.01) |
| *H01L 27/02* | (2006.01) |
| *H01L 21/8238* | (2006.01) |
| *H01L 29/66* | (2006.01) |
| *H01L 29/161* | (2006.01) |
| *H01L 29/16* | (2006.01) |
| *H01L 27/092* | (2006.01) |
| *H01L 29/06* | (2006.01) |

(52) U.S. Cl.
CPC ...... *H01L 27/0255* (2013.01); *H01L 21/3247* (2013.01); *H01L 21/823807* (2013.01); *H01L 21/823821* (2013.01); *H01L 27/0924* (2013.01); *H01L 29/0638* (2013.01); *H01L 29/16* (2013.01); *H01L 29/161* (2013.01); *H01L 29/66537* (2013.01)

(58) Field of Classification Search
CPC ............ H01L 27/0255; H01L 27/0924; H01L 21/823807; H01L 21/823821; H01L 29/0638; H01L 29/16; H01L 29/161; H01L 21/3247; H01L 29/66537
See application file for complete search history.

(56) References Cited

U.S. PATENT DOCUMENTS

| | | | |
|---|---|---|---|
| 7,425,733 | B2 | 9/2008 | Kuramoto |
| 8,053,301 | B2 | 11/2011 | Jaeger et al. |
| 8,610,172 | B2 | 12/2013 | Guo et al. |
| 8,828,851 | B2 | 9/2014 | Loubet et al. |
| 8,901,664 | B2 | 12/2014 | Basker et al. |

(Continued)

FOREIGN PATENT DOCUMENTS

KR   1020080014307   2/2008

OTHER PUBLICATIONS

List of IBM Patents or Patent Applications Treated as Related Dated Jul. 14, 2017, 2 pages.

*Primary Examiner* — Walter H Swanson
(74) *Attorney, Agent, or Firm* — Scully, Scott, Murphy & Presser, P.C.; Daniel P. Morris, Esq.

(57) ABSTRACT

A semiconductor structure is provided that includes an electrostatic discharge (ESD) device integrated on the same semiconductor substrate as semiconductor fin field effect transistors (FinFETs). The ESD device includes a three-dimension (3D) wrap-around PN diode connected to the semiconductor substrate. The three-dimension (3D) wrap-around PN diode has an increased junction area and, in some applications, improved heat dissipation.

20 Claims, 3 Drawing Sheets

(56) References Cited

U.S. PATENT DOCUMENTS

| | | |
|---|---|---|
| 8,908,334 B1 | 12/2014 | Gebreselasie et al. |
| 9,219,078 B2 | 12/2015 | Cheng et al. |
| 2008/0079086 A1 | 4/2008 | Jung et al. |
| 2010/0230744 A1* | 9/2010 | Phua ................. H01L 21/28273 257/325 |
| 2013/0032886 A1 | 2/2013 | Ando et al. |
| 2013/0285208 A1 | 10/2013 | Standaert et al. |
| 2014/0264600 A1 | 9/2014 | Adam et al. |
| 2017/0194312 A1* | 7/2017 | Zhou ................... H01L 27/0255 |

\* cited by examiner

METHOD AND STRUCTURE FOR FORMING BURIED ESD WITH FINFETS

BACKGROUND

The present application relates to a semiconductor structure and a method of forming the same. More particularly, the present application relates to a semiconductor structure including an electrostatic discharge (ESD) device integrated on the same semiconductor substrate as semiconductor fin field effect transistors (FinFETs), and a method of forming such a structure.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, silicon fin field effect transistors (FinFETs) is the next step in the evolution of complementary metal oxide semiconductor (CMOS) devices. Silicon fin field effect transistors (FETs) can achieve higher drive currents with increasingly smaller dimensions as compared to conventional planar FETs.

In FinFET technology, there is a need for providing on-chip electrostatic discharge (ESD) devices along with the FinFET devices. Conventional Fin-type ESD devices have the drawback of poor heat dissipation do to narrow fins. Building ESD devices on a larger planar region will address the heat dissipation issue, but it comes with the drawback of consuming a large area of the structure.

In view of the above, there is a need for providing a semiconductor structure including FinFETs, and an ESD device integrated on a same substrate in which the ESD device circumvents the problems associated with prior art ESD devices.

SUMMARY

A semiconductor structure is provided that includes an electrostatic discharge (ESD) device integrated on the same semiconductor substrate as semiconductor fin field effect transistors (FinFETs). The ESD device of the present application includes a three-dimension (3D) wrap-around PN diode connected to the semiconductor substrate. The three-dimension (3D) wrap-around PN diode of the present application has an increased junction area and, in some applications, improved heat dissipation.

In one aspect of the present application, a semiconductor structure is provided. In one embodiment of the present application, the semiconductor structure may include a semiconductor substrate having an nFET device region, a pFET device region and an ESD device region. The nFET device region of the structure of the present application includes a first functional gate structure straddling over a portion of a silicon fin, wherein the silicon fin extends upwards from a fin portion of a p-type punch through stop region. The pFET device region of the structure of the present application includes a second functional gate structure straddling over a portion of a silicon germanium alloy fin, wherein the silicon germanium alloy fin extends upwards from a fin portion of a first n-type punch through stop region. The ESD device region of the structure of the present application includes a PN diode. The PN diode includes a fin portion of a second n-type punch through stop region and a p-type silicon germanium alloy structure. The fin portion of the PN diode has rounded corners. By "rounded corners" it is meant that the fin portion of the PN diode does not have a planar topmost surface.

In another aspect of the present application, a method of forming a semiconductor structure is provided. In one embodiment of the present application, the method may include providing a semiconductor structure including a semiconductor substrate having an nFET device region containing silicon fins extending upwards from fin portions of a p-type punch through stop region, a pFET device region containing first silicon germanium alloy fins extending upwards from fin portions of a first n-type punch through stop region, and an ESD region containing second silicon germanium alloy fins extending upwards from fin portions of a second n-type punch through stop region, wherein a first functional gate structure is present straddling a portion of each of the silicon fins in the nFET device region, and a second functional gate structure is present straddling a portion of each of the first silicon germanium fins in the pFET device region. Next, the second silicon germanium fins within the ESD device region are removed and, thereafter, a hydrogen anneal is performed to round corners of each fin portion of the second n-type punch through stop region. Next, a p-doped silicon germanium alloy structure is formed on exposed surfaces of the second n-type punch through stop region containing the fin portion having the rounded corners.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
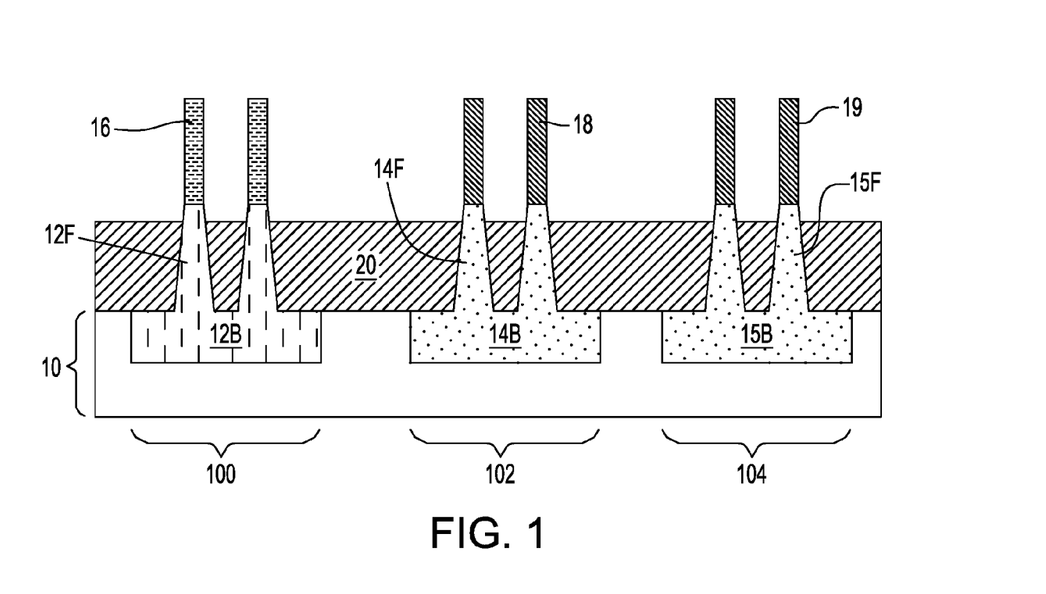
FIG. 1 is a cross sectional view of an exemplary semiconductor structure that can be employed in accordance with an embodiment of the present application, the exemplary semiconductor structure includes a semiconductor substrate having an nFET device region containing silicon fins extending upwards from a p-type punch through stop region, a pFET device region containing first silicon germanium alloy fins extending upwards from a first n-type punch through stop region, and an ESD region containing second silicon germanium alloy fins extending upwards from a second n-type punch through stop region, wherein an isolation structure is present within each of the nFET device region, the pFET device region and the ESD device region.

Referring first to FIG. 1, there is illustrated an exemplary semiconductor structure that can be employed in accordance with an embodiment of the present application. The exemplary semiconductor structure shown in FIG. 1 includes a semiconductor substrate 10 having an nFET device region 100, a pFET device region 102, and an ESD device region 104. Each device region is spaced apart from each other. Although FIG. 1 describes and illustrates a structure in which the nFET device region 102 is located between the pFET device region 100 and the ESD device region 104, other configurations are possible. In one example, the nFET device region 100 could be located between the pFET device region 102 and the ESD device region 104.

The nFET device region 100 is a region of the semiconductor substrate 10 in which nFET devices, such as, for example, nFinFETs, will be subsequently formed. The pFET device region 102 is a region of the semiconductor substrate 10 in which pFET devices, such as, for example, pFinFETs, will be subsequently formed. The ESD device region 104 is a region of the semiconductor substrate 10 in which an ESD device region will be subsequently formed. In the present application, the ESD device region 104 is a region of the semiconductor substrate 10 in which a PN diode will be subsequently formed.

The semiconductor substrate 10 is composed entirely of silicon. The semiconductor substrate 10 may have any of the well known crystal orientations. For example, the crystal orientation of the semiconductor substrate 10 may be {100}, {110}, or {111}. Other crystallographic orientations besides those specifically mentioned can also be used in the present application. The semiconductor substrate 10 is typically a single crystalline silicon material that is non-doped.

As is shown, the nFET device region 100 contains silicon fins 16 extending upwards from a p-type punch through stop region (12B, 12F); the silicon fins are non-doped at this point of the present application. Although two silicon fins 16 are described and illustrated, the present application works when one only a single silicon fin 16 is employed, or when more than two silicon fins 16 are employed.

The p-type punch through stop region (12B, 12F) includes, from top to bottom, at least one fin portion 12F (two fin portions 12F are shown for illustrative purposes) and a base portion 12B. As is shown, each fin portion 12F extends upward from a single base portion 12B. As is further shown, each silicon fin 16 has a bottommost surface that directly contacts the topmost surface of one of the fin portions 12F. Each fin portion 12F has a planar topmost surface and sidewalls that extend outwards from the topmost surface such that the upper portion of each fin portion 12F has a first width, while a bottom portion of each fin portion 12F has a second width that is greater than the first width.

The at least one fin portion 12F and the base portion 12B are both comprised of silicon that is doped with a p-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The p-type punch through stop region (12B, 12F) has a p-type dopant concentration of from $1\times10^{18}$ atoms/cm$^3$ to $1\times10^{19}$ atoms/cm$^3$.

As is shown, the pFET device region 102 contains first silicon germanium alloy fins 18 extending upwards from a first n-type punch through stop region (14B, 14F). Although two first silicon germanium alloy fins 18 are described and illustrated, the present application works when one only a single first silicon germanium alloy fin 18 is employed, or when more than two first silicon germanium alloy fins 18 are employed. The first silicon germanium alloy fins 18 may have a germanium content from 20 atomic percent germanium up to, and including, 70 atomic percent germanium. Other germanium contents that are lesser than 20 atomic percent and greater than 70 atomic percent may also be used as the germanium content of the first silicon germanium alloy fins 18.

The first n-type punch through stop region (14B, 14F) includes, from top to bottom, at least one fin portion 14F (two fin portions 14F are shown for illustrative purposes) and a base portion 14B. Each fin portion 14F has a planar topmost surface and sidewalls that extend outwards from the topmost surface such that the upper portion of each fin portion 14F has a first width, while a bottom portion of each fin portion 14F has a second width that is greater than the first width. As is shown, each fin portion 14F extends upward from a single base portion 14B. As is further shown, each first silicon germanium alloy fin 18 has a bottommost surface that directly contacts the topmost surface of one of the fin portions 14F.

The at least one fin portion 14F and the base portion 14B are both comprised of silicon that is doped with an n-type dopant. The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The first n-type punch through stop region (14B, 14F) has an n-type dopant concentration of from $1 \times 10^{18}$ atoms/cm$^3$ to $1 \times 10^{19}$ atoms/cm$^3$.

As is shown, the ESD device region 104 contains second germanium alloy fins 19 extending upwards from a second n-type punch through stop region (15B, 15F). Although two second silicon germanium alloy fins 19 are described and illustrated, the present application works when one only a single second silicon germanium alloy fin 19 is employed, or when more than two second silicon germanium alloy fins 19 are employed. The second silicon germanium alloy fins 19 may have a germanium content that is within the range mentioned above for the first silicon germanium alloy fins 18.

The second n-type punch through stop region (15B, 15F) includes, from top to bottom, at least one fin portion 15F (two fin portions 15F are shown for illustrative purposes) and a base portion 15B. Each fin portion 15F has a planar topmost surface and sidewalls that extend outwards from the topmost surface such that the upper portion of each fin portion 15F has a first width, while a bottom portion of each fin portion 15F has a second width that is greater than the first width. As is shown, each fin portion 15F extends upward from a single base portion 15B. Each second silicon germanium alloy fin 19 has a bottommost surface that directly contacts the topmost surface of one of the fin portions 15F.

The at least one fin portion 15F and the base portion 15B are both comprised of silicon that is doped with an n-type dopant. The second n-type punch through stop region (15B, 15F) has an n-type dopant concentration that is within the range mentioned above for the first n-type punch through stop region (14B, 14F).

At this point of the present application, an isolation structure 20 is located within the nFET device region 100, the pFET device region 102, and the ESD device region 104. The isolation structure may include at least one dielectric material. In one example, the isolation structure 20 may be composed of silicon dioxide. The isolation structure 20 has a topmost surface that is planar and is located beneath a topmost surface of each of the various fin portions (12F, 14F and 15F) located in the three different device regions (100, 102, 104).

The exemplary semiconductor structure shown in FIG. 1 can be formed utilizing any conventional processing technique known to those skilled in the art. For example, a bulk silicon substrate can first be provided and then patterned to include a plurality of silicon fins. A trench dielectric material (not shown) can then be formed filling the gaps located between each silicon fin. A block mask (also not shown) can then be formed covering a first set of silicon fins, while leaving a second set of silicon fins exposed. An upper portion of each silicon fin that is exposed can be removed leaving a base silicon fin portion, and a silicon germanium fin can be formed in its place and from each silicon base portion via an epitaxial deposition process. After forming the silicon germanium fins, the block mask and the trench dielectric material can be removed and thereafter the various punch-through stop regions can be formed via ion implantation. Next, the isolation structure can be formed by deposition of a dielectric material, followed by planarization and a recess etch.

Figure 2:
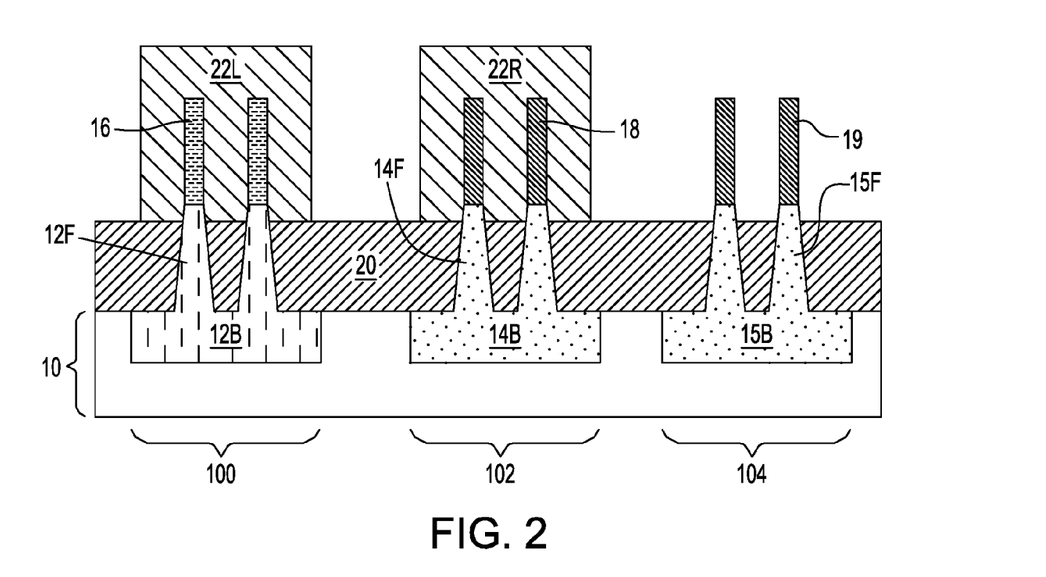
FIG. 2 is a cross sectional view of the exemplary semiconductor structure of FIG. 1 after forming a first functional gate structure straddling a portion of each of the silicon fins in the nFET device region, and a second functional gate structure straddling a portion of each of the first silicon germanium fins in the pFET device region.

Referring now to FIG. 2, there is illustrated the exemplary semiconductor structure of FIG. 1 after forming a first functional gate structure 22L straddling a portion of each of the silicon fins 16 in the nFET device region 100, and a second functional gate structure 22R straddling a portion of each of the first silicon germanium fins 18 in the pFET device region 102; no functional gate structures are formed in the ESD device region 104. Although a single first functional gate structure 22L, and a single second functional gate structure 22R are described and illustrated, a plurality of first functional gate structures and/or a plurality of second functional gate structures can be formed.

The term "straddling" denotes that the functional gate structure is formed across a semiconductor material fin such that a first portion of each functional gate structure is present on one side of the semiconductor material fin and a second portion of each functional gate structure is present on another side of the semiconductor material fin. Also, a portion of the functional gate structure is also located on a topmost surface of a portion of semiconductor material fin.

By "functional gate structure" it is meant a permanent gate structure used to control output current (i.e., flow of carriers in the channel) of a semiconducting device through electrical or magnetic fields. Each functional gate structure (22L, 22R) that is formed includes a gate material stack (not shown) of, from bottom to top, a gate dielectric portion and a gate conductor portion. In some embodiments, a gate cap portion (also not shown) can be present atop the gate conductor portion.

Each gate dielectric portion comprises a gate dielectric material. The gate dielectric material that provides the gate dielectric portion can be an oxide, nitride, and/or oxynitride. In one example, the gate dielectric material that provides the gate dielectric portion can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion.

The gate dielectric material used in providing the gate dielectric portion can be formed by any deposition process including, for example, chemical vapor deposition (CVD), plasma enhanced chemical vapor deposition (PECVD), physical vapor deposition (PVD), sputtering, or atomic layer deposition. In some embodiments and when multiple functional gate structures are formed, each gate dielectric portion comprises a same gate dielectric material. In other embodiments and when multiple functional gate structures are formed, some of the gate dielectric portions may comprise a first gate dielectric material, while other gate dielectric portions may comprise a second gate dielectric material that differs in composition from the first gate dielectric material. When a different gate dielectric material is used for the gate dielectric portions, block mask technology can be used. In one embodiment of the present application, the gate dielectric material used in providing the gate dielectric portion can have a thickness in a range from 1 nm to 10 nm. Other thicknesses that are lesser than, or greater than, the aforementioned thickness range can also be employed for the gate dielectric material.

Each gate conductor portion comprises a gate conductor material. The gate conductor material used in providing the gate conductor portion can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion in the nFET device region 100 may comprise an nFET gate metal. In other embodiments, the gate conductor portion in the pFET device region 102 may comprise a pFET gate metal.

The gate conductor material used in providing the gate conductor portion can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing the gate conductor portion has a thickness from 1 nm to 100 nm. Other thicknesses that are lesser than, or greater than, the aforementioned thickness range can also be employed for the gate conductor material used in providing the gate conductor portion.

If present, the gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure (22L, 22R) can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching. A block mask may be formed over the ESD device region 104 during the forming of the first and second sacrificial gate structures (22L, 22R).

Figure 3:
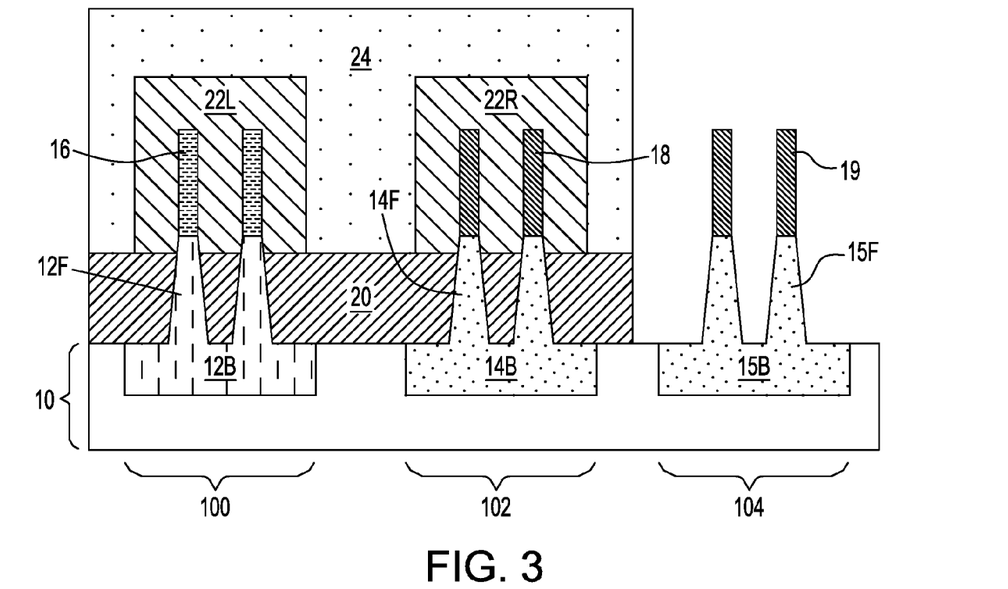
FIG. 3 is a cross sectional view of the exemplary semiconductor structure of FIG. 2 after forming a mask protecting the nFET device region and the pFET device region, while leaving the ESD device region exposed for further processing, and thereafter removing the isolation structure from the ESD device region.

Referring now to FIG. 3, there is illustrated the exemplary semiconductor structure of FIG. 2 after forming a mask 24 protecting the nFET device region 100 and the pFET device region 102, while leaving the ESD device region 104 exposed for further processing, and then removing the isolation structure 20 from the ESD device region 104. The mask 24 that is used in the present application includes any masking material that is impermeable to hydrogen diffusion therethrough. In one embodiment of the present application, mask 24 may include amorphous carbon. Mask 24 can be formed by first depositing the masking material and then patterning the masking material by lithography and etching.

After forming the mask 24 over the nFET device region 100 and the pFET device region 102, the isolation structure 20 within the ESD device region is removed utilizing an etch that is selective in removing the dielectric material that provides the isolation structure 20. In one example, and when the isolation structure 20 includes silicon dioxide, hydrofluoric acid (HF) or a buffer oxide etch (i.e., ammonium fluoride and hydrofluoric acid) can be used.

Figure 4:
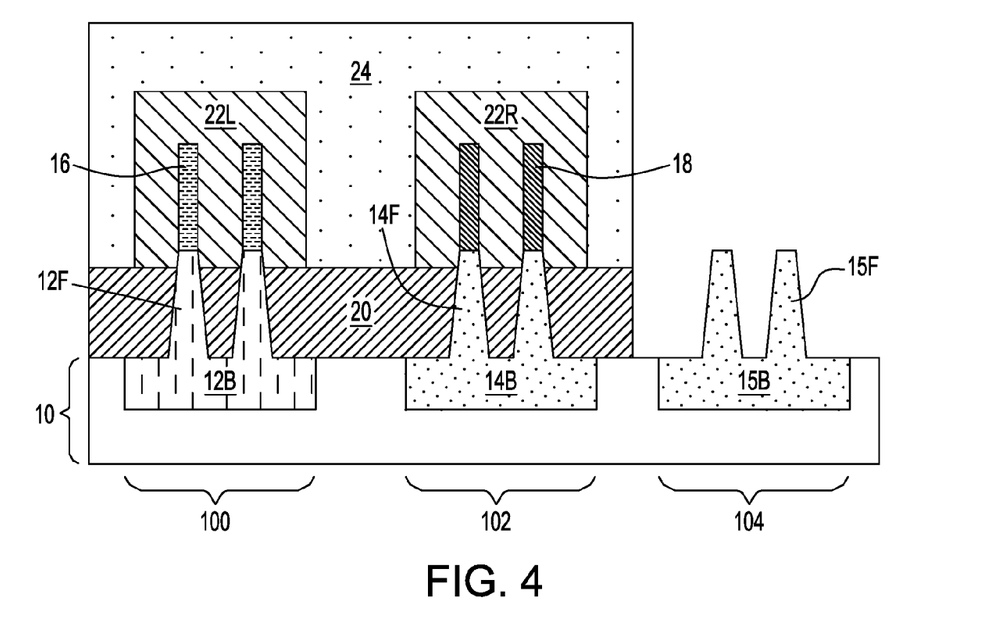
FIG. 4 is a cross sectional view of the exemplary semiconductor structure of FIG. 3 after removing the second silicon germanium fins within the ESD device region.

Referring now to FIG. 4, there is illustrated the exemplary semiconductor structure of FIG. 3 after removing the second silicon germanium alloy fins 19 within the ESD device region 104. After the removal of the second silicon germanium alloy fins 19, the topmost surface and sidewall surfaces of each fin portion 15F within the ESD device region 104 are exposed. Also exposed is a topmost surface of the base portion 15B.

The removal of each second silicon germanium alloy fin 19 in the ESD device region 104, which is performed in the presence of mask 24 still protecting the nFET device region 100 and the pFET device region 102, may be performed utilizing an etch that is selective in removing silicon germanium as compared to silicon. In one embodiment, the etch may include a gaseous hydrochloric gas etch (HCl) which is supplied to an epitaxial reactor.

Figure 5:
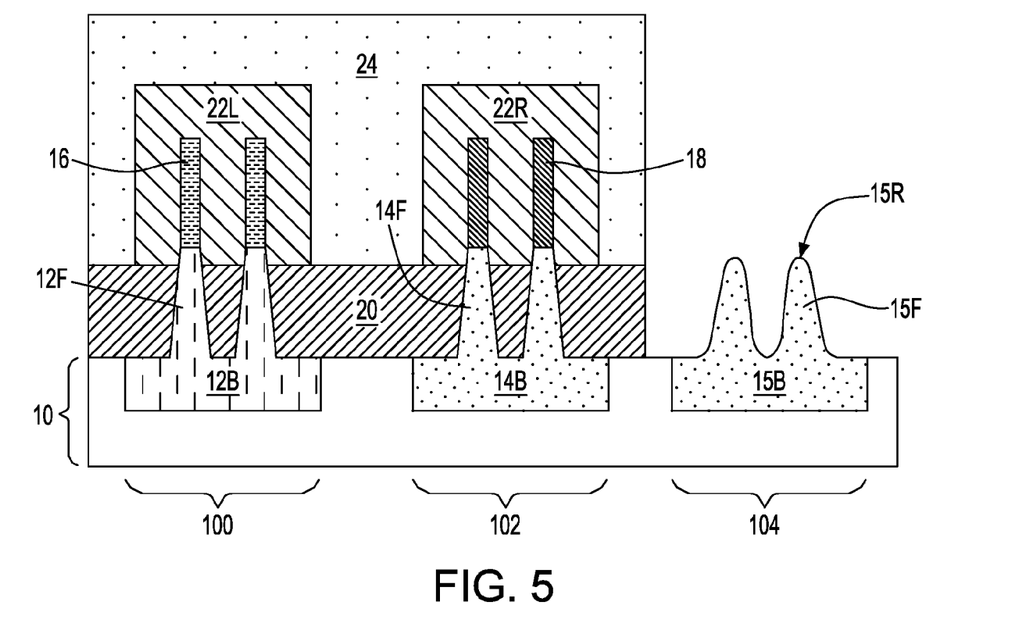
FIG. 5 is a cross sectional view of the exemplary semiconductor structure of FIG. 4 after performing a hydrogen anneal to round the corners of each fin portion of the second n-type punch through stop region.

Referring now to FIG. 5, there is illustrated the exemplary semiconductor structure of FIG. 4 after performing a hydrogen anneal to round the corners the fin portion 15F of the second n-type punch through stop region. In FIG. 5, element 15R denotes the rounded topmost surface of each fin portion 15F. Each fin portion 15F that includes the rounded corners, i.e., topmost surface 15R, has a height that is less than the height of the original fin portion prior to the hydrogen anneal. The fin portion 15F having the rounded topmost surface 15R has an n-type dopant concentration that is substantially the same as that of the fin portion 15F prior to the hydrogen anneal. By "substantially the same" it is meant within ±1 percent of the original dopant concentration.

In some embodiments, the hydrogen anneal that can be employed in the present application may performed at a temperature from 700° C. to 1000° C. In other embodiments, the hydrogen anneal may be performed at a temperature from 500° C. to 900° C. The hydrogen anneal may be performed in hydrogen ambient that may or may not be diluted with an inert gas such as, for example, helium, argon and/or nitrogen. The hydrogen anneal may be performed for a duration from 30 seconds to 1800 seconds. Other hydrogen anneal temperatures and duration can also be used as long as at least a portion of the fin portion 15F remains.

Figure 6:
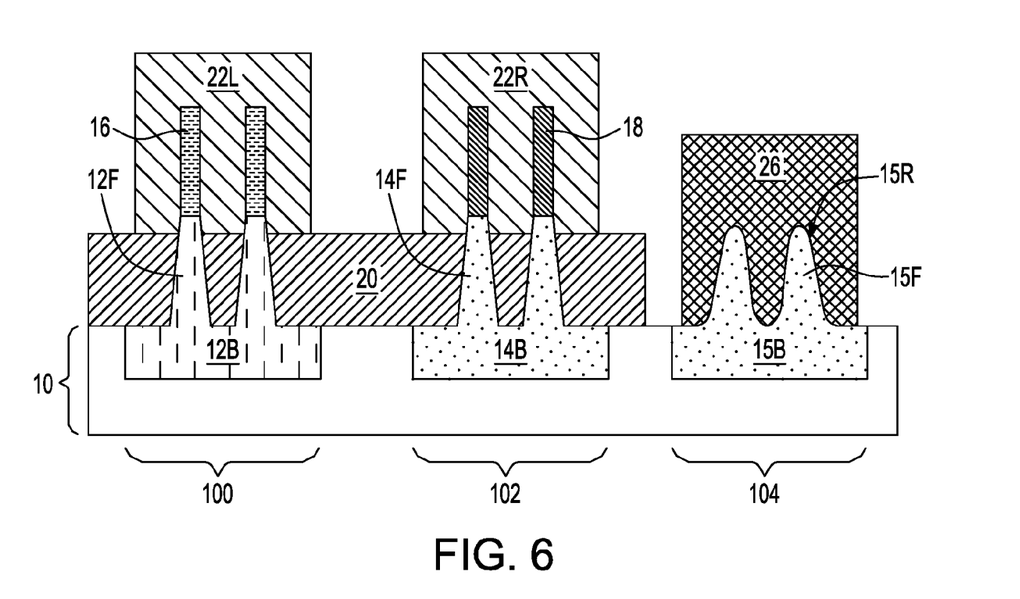
FIG. 6 is a cross sectional view of the exemplary semiconductor structure of FIG. 5 after removing the mask and forming a p-doped silicon germanium alloy structure on the exposed surfaces of the second n-type punch through stop region containing the rounded fin portion, wherein the n-type punch through stop region containing the rounded fin portion and the doped silicon germanium alloy structure collectively provide a PN diode within the ESD device region.

Referring now to FIG. 6, there is illustrated the exemplary semiconductor structure of FIG. 5 after removing the mask 24 and forming a p-doped silicon germanium alloy structure 26 on the exposed surfaces of the second n-type punch through stop region containing the fin portion 15F with the rounded surface 15R. In the present application, the n-type punch through stop region containing the fin portion 15F with the rounded surfaces and base portion 15B, and the doped silicon germanium alloy structure collectively provide a PN diode within the ESD device region 104. The PN diode, which may be referred to as a three-dimension (3D) wrap-around PN diode, has an increased junction area and, in some applications, improved heat dissipation.

Although not shown, p-doped silicon germanium alloy structures would also be epitaxially grown from the exposed surfaces of each silicon fin 15 and each silicon germanium alloy fin 18 not covered by a functional gate structure in the nFET device region 100 and the pFET device region 102. In the nFET device region 100, and the pFET device region 102, the p-doped silicon germanium alloy structures would form the source/drain structures of the respective FinFET device.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In the present application, the p-doped silicon germanium alloy structure 26 thus has an epitaxial relationship with the surface of fin portion 15F containing the rounded surface 15R.

Examples of various epitaxial growth process apparatuses that are suitable for use in forming the silicon germanium alloy that provides the strain relaxed silicon germanium alloy buffer layer 12 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 1150° C.

A number of different sources may be used for the deposition of the silicon germanium alloy that provides the p-doped silicon germanium alloy structure 26. In some embodiments, the source gas may include an admixture of a silicon containing gas source and a germanium containing gas source. Examples of silicon gas sources include silane, disilane, trisilane, tetrasilane, hexachlorodisilane, tetrachlorosilane, dichlorosilane, trichlorosilane, silicon tetrachloride and combinations thereof. Examples of germanium gas sources include germane, digermane, halogermane, dichlorogermane, trichlorogermane, tetrachlorogermane and combinations thereof. In some embodiments, the silicon germanium alloy that provides the p-doped silicon germanium alloy structure 26 can be formed from a source gas that includes a compound containing silicon and germanium. Other source gases or gases mixtures that are known to those skilled in the art can also be used in forming the silicon germanium alloy that provides the p-doped silicon germanium alloy structure 26. Carrier gases like hydrogen, nitrogen, helium and argon can be used.

A p-type dopant as defined above, can be introduced into the source gas used to provide the p-doped silicon germanium alloy structure 26. The p-doped silicon germanium alloy structure 26 may contain a p-type dopant concentration from $1 \times 10^{19}$ atoms/cm$^3$ to $5 \times 10^{20}$ atoms/cm$^3$. The p-doped silicon germanium alloy structure 26 may have a germanium content that is within the range mentioned above for the first silicon germanium alloy fins 18. In some embodiments, the germanium content of the p-doped silicon germanium alloy structure 26 is the same as that of each first silicon germanium alloy fin 18F. In other embodiments, the germanium content of the p-doped silicon germanium alloy structure 26 is different from that of each first silicon germanium alloy fin 18F.

In some embodiments of the present application, the topmost surface of the p-doped silicon germanium alloy structure 26 is located below the topmost surface of each silicon fin 16 and each first silicon germanium alloy fin 18. As is shown, a portion of the p-doped silicon germanium alloy structure 26 may contact a topmost surface of the base portion 15B.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
   providing a semiconductor structure comprising a semiconductor substrate having an nFET device region containing silicon fins extending upwards from fin portions of a p-type punch through stop region, a pFET device region containing first silicon germanium alloy fins extending upwards from fin portions of a first n-type punch through stop region, and an ESD device region containing second silicon germanium alloy fins extending upwards from fin portions of a second n-type punch through stop region, wherein a first functional gate structure is present straddling a portion of each of the silicon fins in the nFET device region, and a second functional gate structure is present straddling a portion of each of the first silicon germanium fins in the pFET device region;
   removing the second silicon germanium fins within the ESD device region;
   performing a hydrogen anneal to round corners of each fin portion of the second n-type punch through stop region; and
   forming a p-doped silicon germanium alloy structure on exposed surfaces of the second n-type punch through stop region containing the fin portions containing the rounded corners.

2. The method of claim 1, wherein the providing the semiconductor structure further comprising forming an isolation structure within the nFET device region, the pFET device region and the ESD device region, and wherein the isolation structure is removed from the ESD device region prior to the performing the hydrogen anneal.

3. The method of claim 2, wherein the isolation structure is located adjacent sidewall surfaces of each fin portion of the p-type punch through stop region, each fin portion of the first n-type punch through stop region, and each fin portion of the second-type punch through stop region.

4. The method of claim 1, wherein a mask is formed protecting the nFET device region and the pFET device region during the removing the second silicon germanium fins and the performing the hydrogen anneal.

5. The method of claim 1, wherein the hydrogen anneal is performed at a temperature from 700° C. to 1000° C. or from 500° C. to 900° C.

6. The method of claim 1, wherein the forming the p-doped silicon germanium alloy structure comprises epitaxial growth of a p-doped silicon germanium alloy.

7. The method of claim 1, wherein a portion of the p-doped silicon germanium alloy structure directly contacts a base portion of the second n-type punch through stop region, and wherein each fin portion of the second n-type punch through stop region extends upwards from the base portion of the second n-type punch through stop region.

8. The method of claim 7, wherein the base portion of the second n-type punch through stop region is embedded in a portion of the semiconductor substrate in the ESD device region.

9. The method of claim 1, wherein the p-type punch through stop region contains, from top to bottom, the fin portions and a base portion, and the first n-type punch through stop region contains, from top to bottom, the fin portions and a base portion, wherein the base portion of the p-type punch through stop region is embedded with a portion of the semiconductor substrate in the nFET device region, and the base portion of the first n-type type punch through stop region is embedded within a portion of the semiconductor substrate in the pFET device region.

10. The method of claim 1, wherein an entirety of each of the p-type punch through stop region, the first n-type punch through stop region, and the second n-type punch through stop region comprises silicon.

11. The method of claim 1, wherein the first n-type punch through stop region and the second n-type punch through stop region have substantially a same n-type dopant concentration.

12. The method of claim 1, wherein the p-type silicon germanium alloy structure has an epitaxial relationship with the fin portions of the second n-type punch through stop region.

13. The method of claim 1, wherein a topmost surface of the p-type silicon germanium alloy structure is located beneath topmost surfaces of each silicon fin and each first silicon germanium alloy fin.

14. The method of claim 1, wherein the first silicon germanium alloy fins and the p-type silicon germanium alloy structure have a germanium content from 20 atomic percent up to, and including, 70 atomic percent.

15. The method of claim 1, wherein the removing the second silicon germanium fins within the ESD device region is performed utilizing an etch that is selective in removing silicon germanium.

16. The method of claim 15, wherein the etch includes a gaseous HCl gas etch.

17. The method of claim 1, wherein the substrate is composed entirely of silicon.

18. The method of claim 1, wherein each of the first functional gate structure and the second function gate structure comprises a gate dielectric portion and a gate conductor portion.

19. The method of claim 18, wherein the gate conductor portion in the pFET device region comprises a pFET gate metal, and the gate conductor portion in the nFET device region comprises an nFET gate metal.

20. The method of claim 7, wherein the p-doped silicon germanium alloy structure, the fin portions containing the rounded corners, and the base portion collectively provide a PN diode in the ESD device region.

* * * * *